Figure 1:
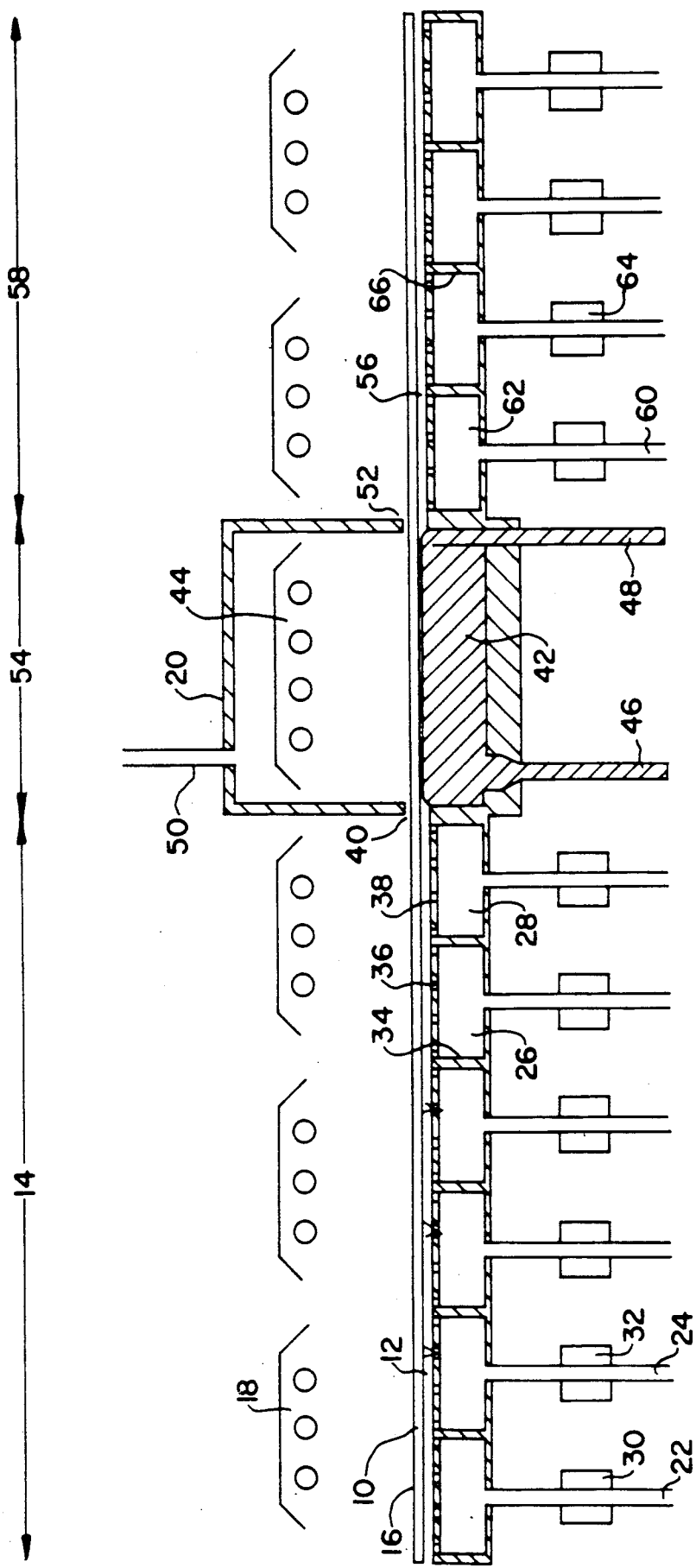

United States Patent [19]

von Campe

[11] Patent Number: 5,053,355
[45] Date of Patent: Oct. 1, 1991

[54] METHOD AND MEANS FOR PRODUCING A LAYERED SYSTEM OF SEMICONDUCTORS

[75] Inventor: Hilmar von Campe, Bad Homburg, Fed. Rep. of Germany

[73] Assignee: Nukem GmbH, Hanau, Fed. Rep. of Germany

[21] Appl. No.: 462,212

[22] Filed: Jan. 9, 1990

[30] Foreign Application Priority Data

Jan. 14, 1989 [DE] Fed. Rep. of Germany ....... 3901042

[51] Int. Cl.[5] .................... H01L 31/18; H01L 21/208
[52] U.S. Cl. .................................. 437/114; 136/258; 118/58; 118/68; 118/69; 118/405; 156/607; 156/616.2; 156/620.1; 156/622; 156/DIG. 88; 437/119; 437/2; 437/4; 437/966; 427/74; 148/DIG. 107

[58] Field of Search ...................... 437/2, 4, 5, 81, 87, 437/102, 109, 114, 119, 159, 965, 966, 967; 136/258 PC; 427/74; 156/607, 616.1, 616.2, 616.4, 619.1, 620.1, 620.2, 620.3, 620.4, 622, 624, DIG. 88; 148/DIG. 107; 118/58, 68–69, 405, 419

[56] References Cited

U.S. PATENT DOCUMENTS

| 4,563,976 | 1/1986 | Foell et al. | 118/401 |
| 4,571,448 | 2/1986 | Barnett | 136/259 |
| 4,599,244 | 7/1986 | Falckenberg et al. | 427/74 |

FOREIGN PATENT DOCUMENTS 3605973 2/1986 Fed. Rep. of Germany .

Primary Examiner—Aaron Weisstuch
Attorney, Agent, or Firm—Cushman, Darby & Cushman

[57] ABSTRACT

A method and means for producing a layered semiconductor system are proposed wherein the required semiconductor layers are deposited on a carrier layer (10) through interaction with a melt (42). The carrier layer (10) itself may have a basic layer consisting of glass or quartz, which in turn may be formed from a melt by solidification on a metal melt.

18 Claims, 3 Drawing Sheets

METHOD AND MEANS FOR PRODUCING A LAYERED SYSTEM OF SEMICONDUCTORS

DESCRIPTION

The invention relates to a method for producing a layered system of semiconductors more particularly for large-area photovoltaic components, with at least one semiconductor layer being applied to a carrier layer such that the carrier layer is brought in contact with a metal melt, said metal melt containing dissolved semiconductor material and said material containing any desired doping substances, and such that, through producing a gradient, like a temperature gradient, between the melt and the carrier layer, the semiconductor material containing any accompanying doping substances is deposited on the carrier layer. The invention also relates to means more particularly for implementing said method.

The costs of producing large-area semiconductur arrangements, such as solar-energy conversion cells, solid-state display screens or flat LCD screens, which are controlled by transistors, increase as their areas increase. This applies in particular to photovoltaic energy generation. The reason for this is the large areas needed to convert sun light into electrical energy. About one third of the total production costs of a solar cell module is accounted for by the production of silicon, the basic material. Processes absorbing high amounts of energy and money are required to impart a degree of purity consonant with reasonable efficiency.

Costs may be reduced by using thin-film components such as thin-film solar cells or thin-film transistors, because such usage requires less semiconductor material. Costs are also determined by the production process, wherein criteria such as material yield from deposition, thickness of layer, or efficiency of the solar cell play a role in choosing the type of technology to be used.

Silicon in its amorphous state has the advantage that, in addition to a small layer thickness, simple deposition on large areas can be carried out at low depositing temperatures. Its disadvantages are the high price of silane (the initial gas), relative low efficiency on large areas and poor long-time stability of the components. Thin polycrystalline silicon layers used in solar cells can be made by CVD deposition or, for example, by vacuum-type vaporizing deposition of silicon. Attempts are also known to recrystallize silicon layers by tempering or by melting on a silicon layer.

Solar cells made by the CVD technique have yielded efficiencies of over 9%, when the layers were deposited on silicon substrates (metallurgical Si). All other substrates produced poorer efficiencies. Solar cells made by vacuum-type vaporizing deposition have displayed efficiencies of about 1% to 3%. This low efficiency is attributed to an increased recombination speed of the minority carriers at the grain boundaries, said carriers being produced by the light. This reduces the photovoltaic current. Other factors may be impurities, which at the existing high deposition temperatures of over 1000° C. diffuse from the substrate into the layer, settle down at the grain boundaries, and thus shorten the free life of the charge carriers. A lowered temperature of the substrate, however, causes the growth of layers with strongly disturbed crystal lattices and smaller grain diameters. U.S. Pat. No. 4,571,448 shows a method for producing photovoltaic layers where polycrystalline Si layers are made by deposition from a tin melt. To do so, the sliding boat technique is used wherein the carrier substrate is pulled along underneath a graphite support fitted with recesses containing the solution of Si in Sn. Deposition itself is preferably on the basis of a temperature gradient existing between the melt and the substrate carrier.

With the melt located above the substrate carrier, there is a limit to the size of the area to be deposited, as otherwise the weight of the melt solution may induce a disturbance, and perhaps a bending or breakage of the substrate carrier. It follows that the height of the melt above the substrate must be limited if large areas are involved, which makes it difficult to achieve uniform distribution of the dissolved substance and results in different rates of deposition. Also, concentration of the dissolved substances in the melt changes rather quickly, so that refilling will be necessary, said refilling negatively affecting continuous operation. Again, impurities from the substrate concentrate rapidly in the melt so that the melt needs to be refilled and renewed during continuous operation. Finally, refilling of the melt has the disadvantage that shocks and/or vibrations or turbulences may occur in the region of the substrate carrier, which, in turn, has a negative effect on the quality of the semiconductor layer.

In DE-OS 36 05 973, a liquid-phase epitaxy arrangement is shown wherein the semiconductor substrate to be coated is moved along underneath melts. This arrangement necessarily also has the disadvantages referred to above.

The object of the present invention is to develop a method and means of the type initially described such that high-purity semiconductor layers containing crystal grains of maximum size are deposited at the lowest possible temperatures, said method to be implemented through simple technology. Special care should be taken to see that controlled temperature conditions prevail in the region of the deposition area, so that, consequently, gradients such as temperature gradients can be adjusted in a controlled and reproducible manner.

The task according to the invention is substantially solved by a method characterized in that the carrier layer is moved along over the melt and on leaving the melt is carried off over gas cushions and cooled in a controlled manner.

It follows from the invention that the carrier layer is moved along the surface of the melt. Continuous recirculation and renewal of the melt as well as convection within the bath ensures that the dissolved component is uniformly distributed in the region of the deposition area. Carrying off the carrier layer, which is coated with semiconductor material, on gas cushions as well as continuous cooling also ensure that the semiconductor layer is lastingly damaged neither by mechanical means nor by sudden or irregular temperature changes.

It can be an advantage to pass the carrier layer over at least one gas cushion upstream of the metal melt to achieve continuous heating. The gas cushion is preferably made up of gas cushion sections each with a different temperature, so as to heat up the carrier layer as desired for deposition and subsequently to cool it down continuously.

Another proposal according to the invention is to move the carrier layer over several metal melts of different composition in order to deposit several layers. This arrangement allows the containers holding the melt to be placed contiguously to each other, so that a continuous process will result.

According to a proposal made by the inventor the carrier layer preferably has a base layer substantially consisting of glass or quartz, said base layer being formed by solidification on a metal melt. An intermediate layer and/or the semiconductor layer may now be deposited from said metal melt or from one of the subsequent metal melts. In order to obtain the intermediate layer, preferably metallic carbide, metallic nitride or metallic boride may be deposited on the base layer by segregation from a solution, or by PVD or CVD techniques, screen printing, plasma injection, or galvanic or wet chemical techniques. In other words, the carrier layer forms the base body of the layered semiconductor system. The carrier layer may be built up from several layers. If the base layer of the carrier layer consists of nonconducting material, a conducting layer must be deposited on said base layer, which may then receive the desired semiconductor layers. Said conducting layer may be referred to as an intermediate layer.

The conducting layer may preferably be produced by deposition of $AlB_2$ from an aluminum melt containing boron or by deposition of $TiAl_3$ from an aluminum melt containing titanium.

The metal melt used in depositing the semiconductor layer contains at least one of the elements Ag, Al, Ga, In, Cd, Pb, Sn or Sb, with Si or Ga present in the melt as a saturated solution.

According to one proposal, a metal melt is used which contains at least one of the elements Al, Ga or In, with at least one binary compound such as Ga-As, Ga-P, Ga-Sb, Al-As, Al-P, Al-Sb, In-As, In-P, In-Sb being dissolved in said metal melt, so that binary or ternary connecting semiconductor layers may be deposited therefrom, such as GaAs, GaP, $Ga_{1-x}Al_x$ As, $GaAs_{1-x}P_x$, etc.

If deposition takes place through a temperature gradient between melt and carrier layer, said gradient is preferably produced by thermal radiation and/or gas cooling.

Independently thereof, the method according to the invention is used preferably to set a temperature difference $\Delta T$ ranging from 1° C. through 100° C. between deposition area and metal melt.

Means for producing a layered semiconductor system more particularly for large-surfaced photovoltaic components, with at least one semiconductor layer being depositable on a carrier layer such that the carrier layer can be brought in contact with a metal melt, said metal melt containing dissolved semiconductor material and said material containing any desired doping substances, and such that, through producing a gradient, like a temperature gradient, between the melt and the carrier layer, the semiconductor material containing any doping substances can be deposited on the carrier layer, are characterized in that the means comprise at least one reaction vessel whose bottom region is filled with the metal melt and in whose top region heating elements are disposed to allow the temperature of the carrier layer to be adjusted in a controlled manner, and that means for producing a gas cushion suited to transport the carrier layer with a semiconductor layer deposited on it are arranged at least downstream of the reaction vessel.

Several reaction vessels are preferably arranged in series, with the metal melt surfaces being adjustable at different levels.

If required, the carrier layer may be moved across several gas cushions and passed to said reaction vessel or vessels and carried away from it or them, wherein said gas cushion sections may have different temperatures to ensure continuous heating or cooling. Further, in order to adjust the temperature in a controlled manner, heating elements are disposed above the route on which the carrier layer is moved.

Each reaction vessel is also fitted with circulating means through which the temperature of the metal melt containing dissolved semiconductor material or doping substances can be set to a consistent temperature as desired, molten metal simultaneously being fed into it in an amount equivalent to the rate of deposition on the carrier layer.

Yet another object of the invention is to provide a melting furnace holding a glass melt arranged upstream of the first reaction container and to distribute said melt, which is in a viscous state, in controlled thickness to the metal melt held in the subsequent reaction vessel in order that the glass melt can be allowed to solidify and, for example, a metallic back contact (intermediate layer) to segregate. From this reaction vessel the carrier layer, being in the form of the glass substrate with a metal layer upon it, passes to another reaction vessel in which a first and possibly doped semiconductor layer is segregated, and preferably in one of the following reaction vessels a second differently doped semiconductor layer is deposited. Subsequently, the layered system produced in this manner passes preferably over gas cushions into a cooling zone where defined cooling of layer and substrate may take place. In order to make available a finished layered system more particularly for a photovoltaic cell, a conducting front contact and perhaps further layers such as antireflective layer and covering means, like a cover plate, will be placed on the outer semiconductor layer.

Figure 2:
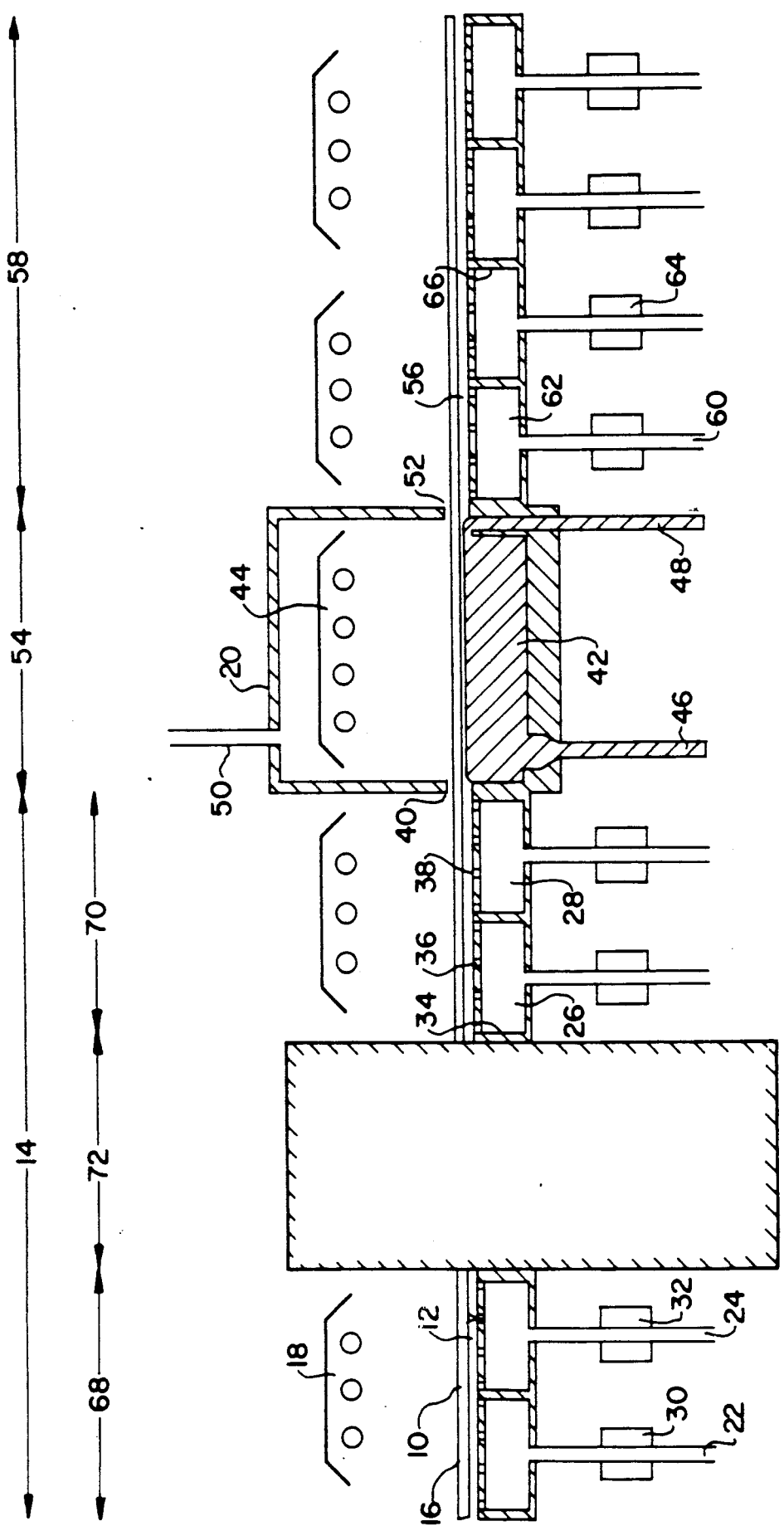
Figure 3:
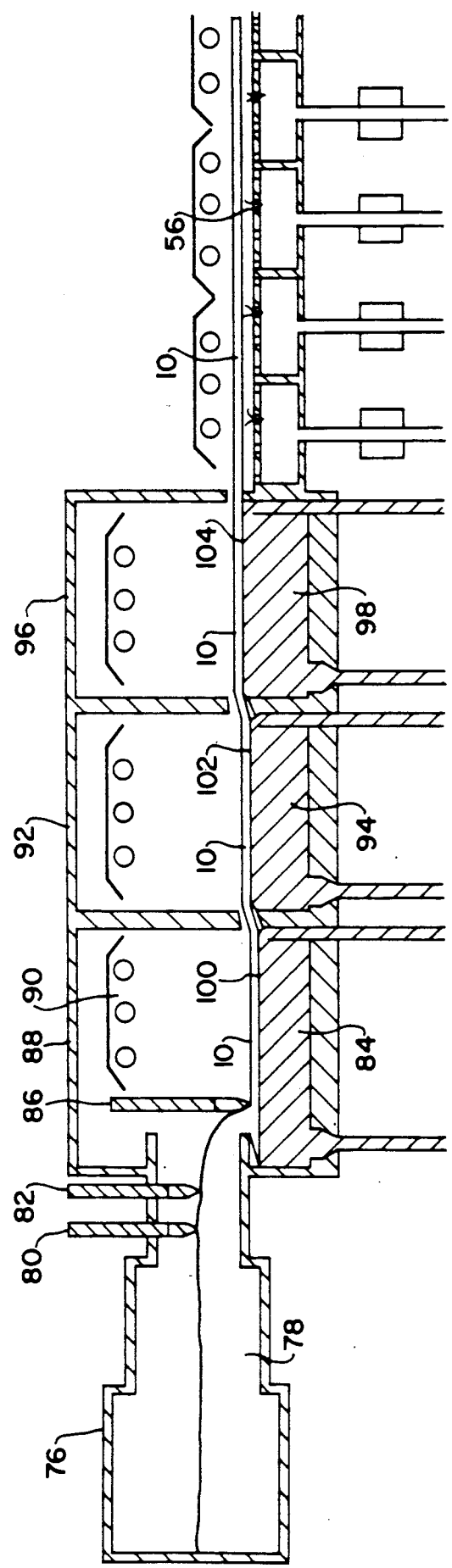

Other details, advantages, and characteristics of the present invention will become apparent not only from the claims and the characteristics described therein—either alone and/or in combination—, but also from the following description of a preferred embodiment illustrated in the accompanying drawing:

FIG. 1 is a general view of means for depositing a semiconductor layer onto a carrier layer, FIG. 2 shows a modification of means as defined in FIG. 1, and FIG. 3 shows means for producing a pn-semiconductor layer.

In FIG. 1 reference numeral (10) is used to identify a carrier layer in the form of a self-supporting substrate which may comprise an intermediate layer, not shown in the drawing, having the form of a layer which acts as a conducting contact, and perhaps with a diffusion barrier layer on it. Substrate (10) is first moved over gas cushions (12) along route (14) where a preliminary treatment takes place, the underside of said substrate facing the gas cushion (12). On the reverse side (16) of substrate (10), heating means (18) are disposed along route (14) so that continuous heating may take place to an extent permitting the substrate, which after having completed route (14) enters a reaction vessel (20), to be coated with a semiconductor layer doped as desired in the manner described below. Heating may for example be from 25° through 950° if silicon is to segregate. There will be additional preliminary treatment of substrate (10) and of the bottom layer in that, along route (14), said substrate and said bottom layer are tempered in a protective gas atmosphere, said tempering being effected by gas cushions (12).

The protective gas is passed through lines into chambers arranged side by side and extending over a length corresponding to the route marked with reference numeral (14). By way of example, supply lines are marked with reference numerals (22) and (24), while air chambers are marked with numerals (26) and (28). Supply lines and chambers may be identically designed. The individual chambers are separated by partitions (see for example reference numeral (34)).

Heating means such as heating sleeves (30), (32) are arranged in supply lines (22) and (24) to bring the protective gas up to the desired temperature. Oppositely to the substrate, chambers (26) and (28) are provided with outlet nozzles (36), (38).

Although in the present embodiment chambers (26), (28) are separated by partitions (34), there may naturally just as well be a single gas chamber extending along route (14) to provide the required gas cushion used in moving the substrate. When heated to a desired temperature, substrate (10) moves through slot (40) into reaction vessel (20) where another layer is to be deposited from a metal melt (42) onto the underside of substrate (10), that is, onto a bottom layer not described in detail. Below slot (40), that is, in the bottom region of reaction vessel (20), there is melt (42) in which the semiconductor material is dissolved. The melt may consist for example of Sn in which Si is dissolved at 950° C. in a saturated solution. If substrate (10) is moved on the surface of melt (42) preferably at a slightly inclined angle to such surface and if the temperature of substrate (10) is set to be below that of melt (42), the melt will be supercooled on the free surface of the intermediate layer and thus the semiconductor material will be saturated, said semiconductor material consequently being deposited on the intermediate layer. The desired temperature of substrate (10) and therefore of the free surface of the intermediate layer is set by heating means disposed in the topmost portion of reaction vessel (20). Metal melt (42) is supplied to reaction vessel (20) through an inlet opening (46) and discharged through an outlet opening (48). In order to maintain constant composition of melt (42), the molten material is continuously recirculated and renewed. In addition, convection at work in the melt ensures uniform distribution of the dissolved components.

A supply line (50) preferably arranged in the topmost portion may be used to feed an inert gas such as Ar to reaction vessel (20). Said gas escapes through inlet slot (40) and through the oppositely disposed outlet slot (52) through which the coated substrate (10) leaves reaction vessel (20).

The transport speed of substrate (10) is set so that a semiconductor layer in the order of 0.1 μm through 200 μm is deposited while substrate (10) passes through reaction vessel (20), that is, during transport along route (54).

When substrate (10) emerges from reaction vessel (20), any molten material remaining on said substrate is removed and said substrate is subsequently moved over gas cushions (56) along a cooling section (58) in order to make sure that the deposited layer or layers is/are continuously cooled down as desired. In accordance with the arrangement as shown, the gas cushions are produced along route (58) by protective gas supplied through lines (60) and gas chambers (62), and heating means (64) such as heating sleeves may be used to adjust the gas temperature stepwise as desired. Chambers (62) are separated by partitions (66).

The temperature of metal melt (42) lies between the melting temperature of the pure metal or the melting temperature of the eutectic that is close to the semiconductor compound to be deposited, and the melting temperature of the semiconductor itself. If silicon (melting temperature 1410° C.) is dissolved in an Sn melt, a temperature of 900° C. through 1000° C. is suited for deposition of a semiconductor layer. If so composed, the Sn melt contains about 5 to 6 at % Si.

Binary solutions containing the elements Ag, Al, Cd, Ga, In, Pb, Sb or Sn are more particularly suited to deposit Si layers on substrate (10). The same elements may also be used to form solutions with germanium. This property allows Ge layers and Si-Ge mixed crystal (solid solution) layers to be deposited, the latter layers if Si and Ge are added in adequate proportion to the solvent. Mixtures of said metal melts may also be used as solvents. The solubility of said metals in Si or Ge is so low that very pure layers can be produced.

Among the materials suitably used as substrates are quartz, glass, ceramics, graphite, metallurgical silicon and metal foils or metal plates (for example of high-grade steel).

Another advantage resulting from the invention as described is that even glass substrates, whose softening temperature is very low, may be used because said substrates float on the melt. In this case, the substrate is carried by the solution. At the same time the glass is coated.

In order to enable metal melts to wet glass or quartz, a wetting layer is placed on the substrate via solution growth, vapor deposition, sputtering, a CVD technique, a PVD technique immersion, or plasma injection.

The intermediate layer referred to above may act as a wetting layer or as a diffusion barrier and/or as a conducting back contact of a solar cell. Materials usable for producing the intermediate layer are metals or metal alloys made up of carbon, metallic borides, metallic carbides, metallic nitrides or metallic silicides. The resultant layers may have a resistivity value below 10 Ω cm which, as mentioned, makes them suitable as back contacts.

The intermediate layer itself may be deposited on substrate (10) in a separate coating plant. As shown in FIG. 2, there are also means to treat substrate (10) in the region of pretreatment section (14). The coating plant shown in FIG. 2 is identical with that illustrated in FIG. 1 so that identical elements are marked with the same reference numerals. Pretreatment section (14) divided into sections (68) and (70) has treatment means (72) in which the intermediate layer may for example be laid down on substrate (10) by means of a PVD technique, a CVD technique, screen printing, plasma injection, or galvanic or wet-chemical deposition. Another benefit accruing from interposing such treatment means (72) is continuous coating and the resultant high throughputs.

One notable embodiment of the invention is shown in FIG. 3 wherein, first, the carrier layer, that is, the self-supporting substrate from a melt and, second, desired layers may be segregated.

In a melting furnace (76) glass is melted. The glass melt (78) so obtained is moved past vertically adjustable valve elements (80), (82) to a metal melt (84) where the floating glass melt solidifies. The thickness of the carrier layer or of substrate (10) is adjusted by another valve or scrape-off element (86). Melt (84) is held in a first reaction container (88) having heating elements (90) in the topmost portion of said container, said elements being set to the desired temperature of the glass melt or of glass substrate (10). An AlB$_2$ layer or a TiAl$_3$ layer may be segregated as a back contact or a wetting layer from melt (84) which is an aluminum melt. Then, while the desired layers are being applied to the surface of melt (84), substrate (10) is moved ahead to a second reaction container (92) which may hold a melt (94) such as a p-doped Si-Sn solution. In reaction container (92), a p-doped silicon layer is deposited from the layers facing melt (94) onto substrate (10). Next, the layered system so obtained moves to a third reaction container (96) where another metal melt (98) which may be a phosphorus-doped Si-Sn solution is used to segregate a second n-conducting Si semiconductor element. Upon leaving reaction container (96), the substrate together with the desired layers is carried off over gas cushions (56) and continuously cooled as desired.

As is shown in FIG. 3, surfaces (100), (102) and (104) of melts (84), (94), (98) are arranged at different levels, said levels ascending from the first reaction chamber (88) to the last reaction chamber (96). This makes for a stepwise melt-to-melt passage, an arrangement that prevents the materials flow from slowing down.

I claim:

1. A method for producing a layered system of semiconductors for large-area photovoltaic components, with at least one semiconductor layer being applied to a carrier layer when the carrier layer contacts a metal melt containing dissolved semiconductor material having at least one doping substance, the semiconductor material being applied to the carrier layer due to a gradient between the metal melt and the carrier layer, comprising the steps of:
    passing the carrier layer over a surface of the metal melt to apply the semiconductor material to the carrier layer; and
    transporting the carrier layer and the semiconductor material applied thereto from the metal melt on a gas cushion to cool the carrier layer and the semiconductor material in a controlled manner.

2. The method of claim 1, further comprising the steps of transporting the carrier layer on a second gas cushion to the metal melt and heating the carrier layer continuously to a temperature needed for application of the semiconductor material.

3. The method of claim 2, wherein the second gas cushion is supplied from a plurality of gas chambers having different temperatures, further comprising the step of transporting the carrier layer on the second gas cushion over the gas chambers to effectuate a continuous heating of the carrier layer.

4. The method of claim 1, further comprising the steps of passing the carrier layer over surfaces of a plurality of metal melts having different compositions so as to apply a plurality of layers to the carrier layer.

5. The method of claim 4, wherein the carrier layer has a base layer consisting of one of glass and quartz, and further comprising the steps of forming said base layer from a melt by solidification on one of said plurality of metal melts and applying the semiconductor material from said one metal melt or a subsequent one of said metal melts.

6. The method of claim 1, wherein the metal melt contains at least one of the elements Ag, Al, Ga, In, Cd, Ph, Sn, or Sb, and at least one of Si and Ge as a saturated solution.

7. The method of claim 1, wherein the metal melt contains at least one of the elements Al, Ga, or In, and at least one of the binary compounds GaAs, GaP, GaSb, AlAs, AlP, AlSb, InAs, InP, InSb being dissolved in said metal melt.

8. The method of claim 1, wherein the carrier layer comprises a base layer consisting of one of glass, ceramics, graphite, metallurgical silicon, and metal.

9. The method of claim 8, wherein one of metallic carbide, metallic nitride, and metallic boride is applied to the base layer by one of segregation from a solution, a PVD technique, a CVD technique, screen printing, plasma injection, sputtering, a galvanic technique, and a wet chemical technique.

10. The method of claim 8, wherein the gradient is a temperature gradient, and the temperature gradient between the metal melt and an application area of the carrier layer is produced by one of gas cooling and thermal radiation.

11. The method of claim 10, wherein the temperature gradient $\Delta T$ between the application area and the metal melt is set at $1° C. < \Delta T < 100° C.$ 12. The method of claim 1, wherein the gas cushion is supplied from a plurality of gas chambers having different temperatures, further comprising the step of transporting the carrier layer and the semiconductor material applied thereto on the gas cushion over the gas chambers to effectuate a continuous cooling of the carrier layer and the semiconductor material.

13. The method of claim 1, wherein the metal melt is contained in a reaction vessel, further comprising the step of filling and recirculating the metal melt from the bottom of the reaction vessel.

14. An apparatus for producing a layered semiconductor system for large-surfaced photovoltaic components, comprising:
    at least one reaction vessel for applying at least one semiconductor layer to a carrier layer, said reaction vessel comprising:
        a bottom portion, disposed beneath a path of the carrier layer, for storing a metal melt and for applying the semiconductor layer to the bottom of said carrier layer; and
        a top portion, having heating elements disposed therein, for producing a desired temperature gradient to facilitate the application of the semiconductor layer to the carrier layer; and
    means for producing a gas cushion to transport the carrier layer to and from said reaction vessel.

15. An apparatus of claim 14, further comprising a plurality of reaction vessels arranged in series, each of said reaction vessels providing a metal melt surface which is adjustable to different levels.

16. An apparatus of claim 14, further comprising a melting furnace arranged in front of said reaction vessel for applying a glass melt to the metal melt said reaction vessel.

17. An apparatus of claim 14, further comprising means for supplying and recirculating the metal melt in the bottom portion of said reaction vessel.

18. A method for producing a layered system of semiconductors for large-area photovoltaic components, with at least one semiconductor layer being applied to a carrier layer when the carrier layer contacts a metal melt containing dissolved semiconductor material having at least one doping substance, the semiconductor material being applied to the carrier layer due to a gradient between the metal melt and the carrier layer, comprising the steps of:

transporting the carrier layer on a first gas cushion through a first region;

heating the carrier layer in a controlled manner in the first region;

passing the carrier layer over a surface of the metal melt in a second region to apply the semiconductor material to the carrier layer; and transporting the carrier layer and the semiconductor material applied thereto on a second gas cushion through a third region; and cooling the carrier layer and the semiconductor material in a controlled manner in the third region.

* * * * *